United States Patent
Nishimura

(10) Patent No.: US 10,333,052 B2
(45) Date of Patent: Jun. 25, 2019

(54) VIBRATING DEVICE

(71) Applicant: Murata Manufacturing Co., Ltd., Nagaokakyo-shi, Kyoto-fu (JP)

(72) Inventor: Toshio Nishimura, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 436 days.

(21) Appl. No.: 15/357,218

(22) Filed: Nov. 21, 2016

(65) Prior Publication Data

US 2017/0069822 A1 Mar. 9, 2017

Related U.S. Application Data

(63) Continuation of application No. PCT/JP2015/067974, filed on Jun. 23, 2015.

(30) Foreign Application Priority Data

Jul. 10, 2014 (JP) .................................. 2014-142309

(51) Int. Cl.
   *H01L 41/053* (2006.01)
   *H01L 41/107* (2006.01)
   *H03H 9/02* (2006.01)

(52) U.S. Cl.
   CPC .......... *H01L 41/053* (2013.01); *H01L 41/107* (2013.01); *H03H 9/02228* (2013.01); *H03H 9/02338* (2013.01)

(58) Field of Classification Search
   CPC combination set(s) only.
   See application file for complete search history.

(56) References Cited

U.S. PATENT DOCUMENTS 7,990,232 B1 * 8/2011 Lee .................... H03H 9/02338
                                                     333/186
9,013,088 B1 * 4/2015 Sparks ................ H03H 3/0076
                                                     310/313 R (Continued)

FOREIGN PATENT DOCUMENTS

JP      H10-117120 A    5/1998
JP      2001-168675 A   6/2001

(Continued)

OTHER PUBLICATIONS

H. Fatemi; "High-Frequency Thin-Film AlN-on-Diamond Lateral Extensional Resonators"; Journal of Microelectromechanical Systems, Jun. 2013, vol. 22, No. 3, pp. 678-686.

(Continued)

*Primary Examiner* — Bryan P Gordon
(74) *Attorney, Agent, or Firm* — Arent Fox LLP

(57) ABSTRACT

A vibrating device includes a vibration plate that vibrates at a harmonic of a contour vibration and on which plural vibration members to are disposed. Moreover, support members are provided having first ends connected to the vibration plate and second ends connected to a frame base that surrounds the vibration plate. Cavities extending in a direction that intersects a direction in which the support members extend are formed in the base with flexure-vibration members formed therebetween. Both ends of the flexure-vibration members are joined to the base to serve as stationary ends. Moreover, a length between ends of the flexure-vibration members and a connected portion where each of the flexure-vibration member is connected to the corresponding support members is $\lambda/4$, where $\lambda$ is a wave length of a flexural vibration corresponding to a frequency of a natural vibration in the vibration plate.

20 Claims, 5 Drawing Sheets

(56) References Cited

U.S. PATENT DOCUMENTS

| | | | |
|---|---|---|---|
| 2010/0156566 A1 | 6/2010 | Abdolvand | |
| 2011/0226058 A1* | 9/2011 | Yoneda | G01C 19/5755 |
| | | | 73/504.12 |
| 2012/0092082 A1* | 4/2012 | Hentz | H03H 9/02338 |
| | | | 331/154 |
| 2013/0175897 A1* | 7/2013 | Ohtsuka | H03H 9/02338 |
| | | | 310/300 |

FOREIGN PATENT DOCUMENTS

| | | |
|---|---|---|
| JP | 2010-147875 A | 7/2010 |
| WO | WO 2010/110918 A1 | 9/2010 |
| WO | WO 2015/002261 A1 | 8/2015 |

OTHER PUBLICATIONS

International Search Report issued for PCT/JP2015/067974, dated Aug. 25, 2015.
Written Opinion of the International Searching Authority issued for PCT/JP2015/067974, dated Aug. 25, 2015.
B.P. Harrington et al.; "Toward Ultimate Performance in GHZ MEMS Resonators: Low Impedance and High Q"; Proceedings of the IEEE International Conference on Micro Electro Mechanical Systems (MEMS), Feb. 2010.

* cited by examiner

VIBRATING DEVICE

CROSS REFERENCE TO RELATED APPLICATIONS

The present application is a continuation of PCT/JP2015/067974 filed Jun. 23, 2015, which claims priority to Japanese Application No. 2014-142309, filed Jul. 10, 2014, the entire contents of each of which are incorporated herein by reference.

FIELD OF THE INVENTION

The present invention relates to a vibrating device in which a support member that supports a vibration plate is connected to the vibration plate that vibrates at a harmonic of a contour vibration.

BACKGROUND OF THE INVENTION

Conventionally, vibrating devices using various vibration modes are used, for example, as resonators. Such a vibrating device requires a vibration plate to be supported in such a manner so as to not disturb vibration of the vibration plate.

In Patent Document 1 (identified below), a T-shaped support member is connected to a vibration member that vibrates in a longitudinal mode at the center of a surface of the vibration member extending in the length direction. The T-shaped support member includes a first portion extending in a first direction and a second portion that is connected to the first portion at the center of a side surface of the first portion and extends in a second direction perpendicular to the first direction. An end of the second portion is connected to the vibration member. The side surface of the first portion opposite the side surface connected to the second portion faces a slit formed in a base. The slit extends in the direction in which the first portion extends.

In the T-shaped support member, vibrations that have propagated from the second portion cause flexural vibrations of part of the first portion facing the slit. The part of the first portion that produces flexural vibrations serves as a vibration-reflecting portion. The length of the vibration-reflecting portion, that is, the length in the first direction, is a quarter of the wave length λ of main vibrations propagating from the vibration member.

In Patent Document 2 (identified below), support members are connected to a vibration member at the center of surfaces of the vibration member in the length direction. A support frame disposed so as to surround the vibration member is connected to the support members. Patent Document 2 discloses that a T-shaped support member enables leaks of vibrations to be suppressed.

In a structure disclosed in Non Patent Document 1 (identified below), pairs of support members are connected to nodes of a vibration plate that vibrates at a harmonic of a contour vibration. Non Patent Document 1 discloses that pairing the support members enables a spurious mode near the support members to be suppressed and enables the Q factor of main vibrations to be improved.

Patent Document 1: WO2010/110918.
Patent Document 2: Japanese Unexamined Patent Application Publication No. 10-117120.
Non Patent Document 1: "TOWARD ULTIMATE PERFORMANCE IN GHZ MEMS RESONATORS: LOW IMPEDANCE AND HIGH Q" B. P. Harrington, M. Shahmohammadi and R. Abdolvand Oklahoma State University, Tulsa, Okla., USA.

In a vibrating device disclosed in Patent Document 1, the length of the vibration-reflecting portion is λ/4. Accordingly, vibrations cannot be confined and are likely to leak to the base side.

The area of held portions joined to both ends of the first portion of the T-shaped support member is small. Accordingly, a difference in acoustic impedance between a T-shaped support arm and the held portions is small, and an acoustic reflection effect is not sufficient.

In a vibrating device disclosed in Patent Document 2, the relation between the shape and dimension of the support members and the wave length of vibrations excited at the vibration plate is not taken into account. Accordingly, leaks of the vibrations cannot be sufficiently suppressed.

In a vibrating device disclosed in Non Patent Document 1, the main vibrations may damp because of firm fixation to the support members. Accordingly, vibration characteristics are not sufficient.

SUMMARY OF THE INVENTION

An object of the present invention is to provide a vibrating device that vibrates at a harmonic of a contour vibration and has excellent vibration characteristics.

Accordingly, a vibrating device is disclosed herein that includes a vibration plate that vibrates at a harmonic of a contour vibration and on which plural vibration members are disposed. Moreover, at least one support member is disposed that has a first end connected to a vibration node portion of at least one of the vibration members and a second end opposite the first end and that supports the vibration plate. Further, a frame base is provided that is connected to the second end of the support member and that is disposed so as to surround the vibration plate. A cavity extending in a direction intersecting a direction in which the support member extends is formed in the base such that a flexure-vibration member whose both ends are stationary ends is formed therebetween. A length between each stationary end a portion of the flexure-vibration member that is connected to the second end of the support member is $\lambda/4$, where $\lambda$ is a wave length of a flexural vibration corresponding to a frequency of a natural vibration in the vibration plate.

In an aspect of the vibrating device disclosed herein, the vibrating device is formed by a single plate body, and includes a plurality of through-slots surrounding the vibration plate except for a portion at which the support member connects the vibration plate to the base.

In another aspect of the vibrating device disclosed herein, the vibration members each include a Si layer made of a degenerate semiconductor and an excitation portion that is stacked on the Si layer. The excitation portion includes a piezoelectric thin film and first and second electrodes through which a voltage is applied to the piezoelectric thin film.

In another aspect of the vibrating device disclosed herein, a distance between an outer circumferential edge of the vibration plate and the base is equal to a distance between the outer circumferential edge of the vibration plate and the flexure-vibration member.

In another aspect of the vibrating device disclosed herein, a distance between an outer circumferential edge of the vibration plate and the base is less than a distance between the outer circumferential edge of the vibration plate and the flexure-vibration member.

In another aspect of the vibrating device disclosed herein, the support member includes a pair of support members.

In another aspect of the vibrating device disclosed herein, the support member includes a plurality of pairs of support members.

In the exemplary vibrating device, since the ends of the flexure-vibration member are joined to residual portions of the base, and the joined portions are the stationary ends, the acoustic reflection effect is sufficient. Accordingly, vibrations that have propagated at a harmonic of a contour vibration from the vibration plate can be surely confined on the vibration plate side by using vibrations of the flexure-vibration member. Consequently, vibration characteristics can be improved.

DETAILED DESCRIPTION OF EXEMPLARY EMBODIMENTS

Embodiments of the present invention will hereinafter be described in detail with reference to the drawings to clarify the present invention.

Figure 1A:
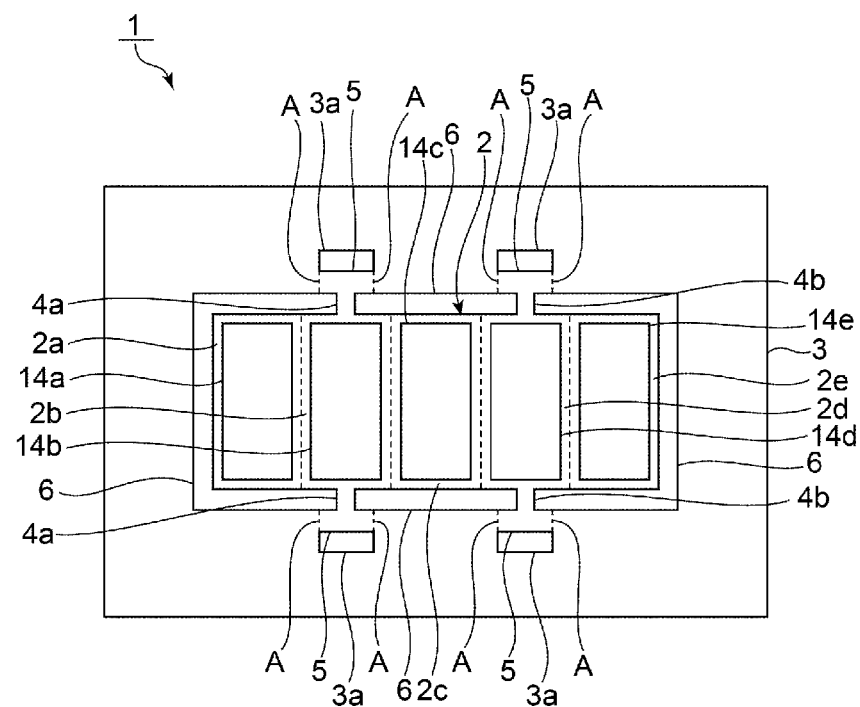
FIG. 1(a) is a plan view of a vibrating device according to a first embodiment.

FIG. 1(a) is a plan view of a vibrating device according to a first embodiment. A vibrating device 1 includes a rectangular plate-shaped vibration plate 2 that has a length direction and a width direction. The vibration plate 2 is strongly excited at a harmonic of a contour vibration.

In the present disclosure, the term "contour vibration" is used as a general term for vibrations including an expansion vibration, a width expansion vibration by which a dimension in the width direction varies, and a vibration that causes expansion and contraction in the length direction. In the embodiment, a harmonic of the width expansion vibration is used, as described later.

The vibration plate 2 is formed in a manner in which five rectangular plate-shaped vibration members 2a to 2e that have a length direction and a width direction are disposed in a row. The width direction of the five vibration members 2a to 2e coincides with the length direction of the vibration plate 2. The length direction of the five vibration members 2a to 2e coincides with the width direction of the vibration plate 2.

The vibration plate 2 is connected to a frame base 3 by using support members 4a and 4b. The shape of the outer circumferential edge of the base 3 is, but not limited to, a rectangle.

The support members 4a and 4b are connected to a side surface of the rectangular plate-shaped vibration plate 2. More specifically, one of the support members 4a is connected to the vibration member 2b at the center of a side surface of the vibration member 2b, and one of the support members 4b is connected to the vibration member 2d at the center of a side surface of the vibration member 2d. The other support members 4a and 4b are connected to side surfaces of the vibration members 2b and 2d on the opposite side of the above side surfaces. That is, two pairs of the support members 4a and 4b are disposed.

The support members 4a and 4b each include a first end portion connected to the vibration plate 2 and a second end portion connected to the base 3. The second end portion is on the opposite side of the first end portion.

The second end portions of the support members 4a and 4b are connected to flexure-vibration members 5. The flexure-vibration members 5 are portions that are formed between cavities 3a and the support members 4a and 4b in a manner in which the cavities 3a are formed in the base 3. In other words, the cavities 3a extending in the direction perpendicular to the direction in which the support members 4a and 4b extend are formed in the base 3. That is, the cavities 3a are formed so as to extend in the direction parallel with the side surfaces of the rectangular plate-shaped vibration plate 2 to which the support members 4a and 4b are connected.

Portions of the base 3 between the cavities 3a and the support members 4a and 4b form the flexure-vibration members 5. The outer edges of the flexure-vibration members 5 face the cavities 3a. The opposite edges face through-slots 6. More specifically, the through-slots 6 are formed in the rectangular plate-shaped base 3 such that the vibration plate 2 and the two pairs of the support members 4a and 4b are formed.

In other words, the vibration plate 2 is surrounded by the frame base 3 with the through-slots 6 interposed therebetween. The distance between an outer circumferential edge of the vibration plate 2 and the base 3 is consequently equal to the distance between the outer circumferential edge of the vibration plate 2 and the corresponding flexure-vibration member 5.

Figure 2:
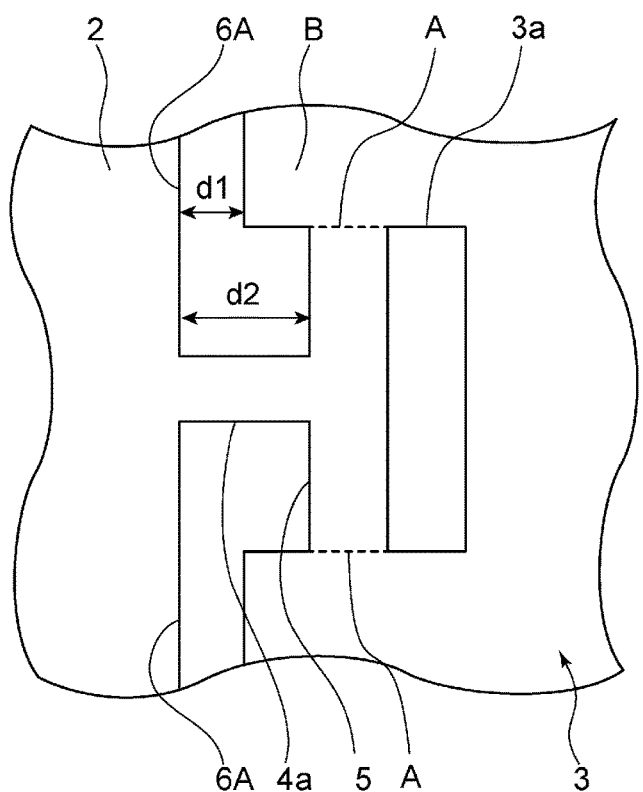
FIG. 2 is a plan view of part of a vibrating device according to a first modification to the first embodiment.

As in the case of a first modification to the vibrating device illustrated in FIG. 2, through-slots 6A may be formed such that the distance d1 between an outer circumferential edge of the vibration plate 2 and the base 3 is less than the distance d2 between the outer circumferential edge of the vibration plate 2 and the corresponding flexure-vibration member 5. In this case, the area of portions B of the base 3 outside dashed lines A representing stationary ends can be increased. Accordingly, an acoustic reflection effect, described later, can be further enhanced, and vibrations can be more surely confined.

Referring back to FIG. 1(a), the flexure-vibration members 5 extend in the direction in which the cavities 3a extend. The positions of the end portions of the flexure-vibration members 5 are represented by the dashed lines A in FIG. 1(a). That is, the end portions of the flexure-vibration members 5 in the length direction thereof are the end portions of the flexure-vibration members 5 in the length direction of the cavities 3a. In other words, portions between the cavities 3a and the through-slots 6 form the flexure-vibration members 5.

Figure 1B:
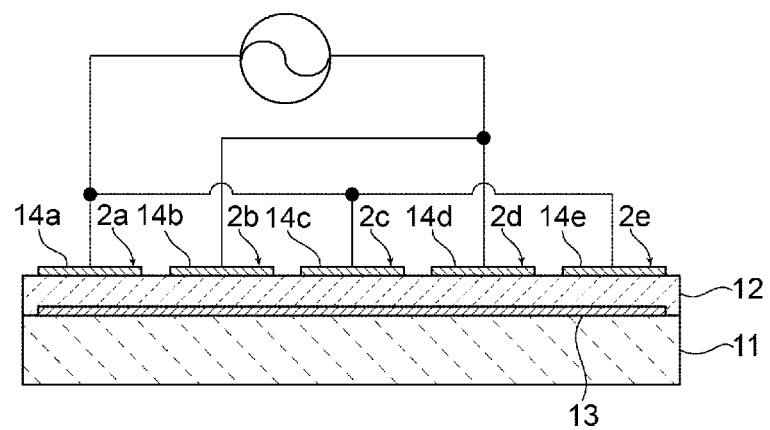
FIG. 1(b) is a front sectional view of principal parts thereof.

In the embodiment, the vibration plate 2 has a layered structure illustrated in FIG. 1(b). As illustrated in FIG. 1(b), the vibration plate 2 is formed of the five vibration members 2a to 2e. The vibration member 2a will be described by way of example.

In the vibration member 2a, a first electrode 13 is stacked on a Si layer 11 made of a degenerate semiconductor. A silicon oxide layer may be disposed between the Si layer 11 and the first electrode 13, although this is not illustrated in FIG. 1(b). The Si layer 11 made of a degenerate semiconductor may serve a function of the first electrode 13.

The silicon oxide layer stacked enables frequency and temperature characteristics to be improved. The silicon oxide layer may be disposed below the Si layer 11 or above a second electrode 14a. Silicon oxide layers may be formed on both surfaces of the Si layer 11. In this case, warping of the Si layer can be suppressed.

The Si layer 11 is a degenerate semiconductor formed by doping Si with an n-type dopant. In this case, the concentration of the dopant is $5 \times 10^{19}$ pieces/cm$^3$ or more. The dopant is not particularly limited. Phosphorus (P) is preferably used as the n-type dopant. In the case of using phosphorus (P), an n-type degenerate semiconductor can be readily manufactured.

A piezoelectric thin film 12 and the second electrodes 14a to 14e are stacked in this order on the first electrode 13. The first electrode 13, the piezoelectric thin film 12, and the second electrodes 14a to 14e form an excitation portion.

The piezoelectric thin film 12 is oriented in the width direction. Accordingly, when an alternating electric field is applied between the second electrodes 14a to 14e and the first electrode 13, the excitation portion is excited. The Si layer 11 is a degenerate semiconductor, as described above. Accordingly, the vibration member 2a is a vibrating body having a so-called MEMS structure. The vibration member 2a vibrates in a width expansion mode.

The other vibration members 2b to 2e are formed in the same manner as in the case of the vibration member 2a. The vibration members 2a to 2e share the Si layer 11, the piezoelectric thin film 12, and the first electrode 13.

As illustrated in FIG. 1(b), the alternating electric field is applied such that adjoining vibration members of the vibration members 2a to 2e are in anti-phase with each other. Accordingly, the adjoining vibration members of the vibration members 2a to 2e vibrate in anti-phase with each other in the width expansion mode. The width direction of the rectangular plate-shaped vibration members 2a to 2e coincides with the length direction of the rectangular plate-shaped vibration plate 2. Accordingly, the vibration plate 2 is strongly excited at a harmonic of a width expansion vibration of contour vibrations.

Figure 3:
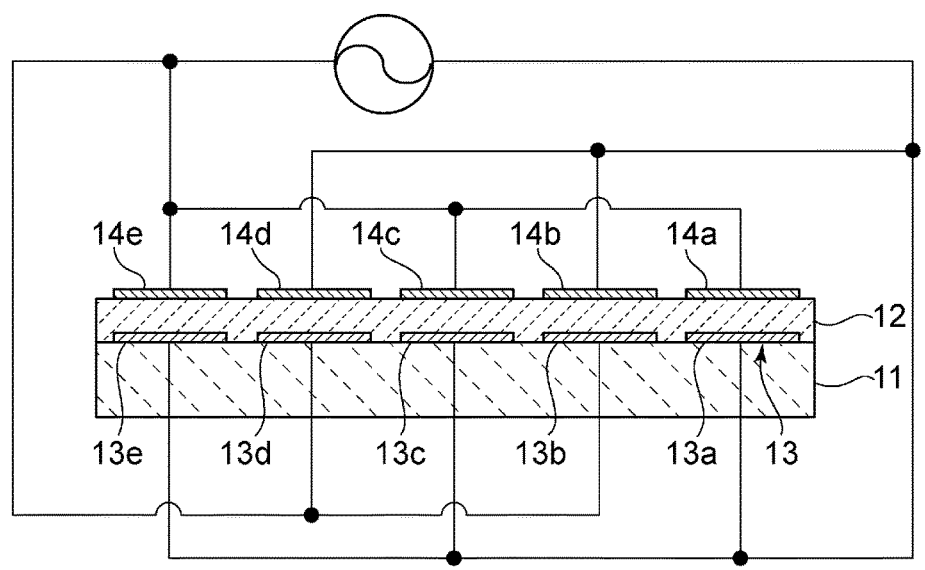
FIG. 3 is a front sectional view of principal parts of a vibrating device according to a second modification to the first embodiment.

In the embodiment, an electric potential is applied to only the second electrodes 14a to 14e, and the first electrode 13 shared by the vibration members 2a to 2e acts as a floating electrode. As in the case of a second modification to the vibrating device according to the first embodiment illustrated in FIG. 3, in the vibration members 2a to 2e, first electrodes 13a to 13e may be respectively disposed. In this case, as illustrated in FIG. 3, an electric potential is applied to adjoining electrodes of the second electrodes 14a to 14e and adjoining electrodes of the first electrodes 13a to 13e in anti-phase with each other.

Referring back to FIG. 1(a), the support members 4a are connected to the vibration member 2b at the center in the width direction. Vibration nodes are located near the center of the vibration member 2b in the width direction, and accordingly, the support members 4a are connected to the nodes. Similarly, the support members 4b are connected to vibration nodes located at the center of the vibration member 2d in the width direction.

Thus, the vibrations of the vibration plate 2 are unlikely to be transmitted to the support members 4a and 4b. In addition, in the embodiment, the flexure-vibration members 5 enable vibrations to be surely confined within portions up to the flexure-vibration members 5. Consequently, vibration characteristics can be improved. This will be described in detail.

In the embodiment, the direction in which the support members 4a and 4b extend is perpendicular to the direction in which the flexure-vibration members 5 extend. The flexure-vibration members 5 face the through-slots 6 on the inner edge side and face the cavities 3a on the outer edge side. Accordingly, when vibrations are transmitted from the vibration plate 2 via the support members 4a and 4b, the flexure-vibration members 5 start a flexural vibration in a direction perpendicular to a plane direction of the base 3. In this case, both ends of the flexure-vibration members 5 are stationary ends. That is, since the ends of the flexure-vibration members 5 represented by the dashed lines A are joined to the base 3, the ends are the stationary ends.

In the embodiment, the vibrations that have propagated are converted into vibrations of the flexure-vibration members 5, and the interfaces between the flexure-vibration members 5 and the base 3 function as stationary ends for flexural vibrations. Accordingly, the flexural vibrations are reflected from the interfaces, and transmission of the vibrations to the side of the base 3 can be effectively suppressed.

In particular, since the area of the portions of the base outside of the stationary ends represented by the dashed lines A is large, the acoustic impedance of the base 3 can be increased. Accordingly, the acoustic reflection effect on the portions represented by the dashed lines A can be enhanced. Consequently, the effect of confining vibrations within the portions up to the flexure-vibration members 5 can be enhanced.

Both ends of the flexure-vibration members 5, that is, the stationary ends are joined to residual portions of the base 3, as described above. Accordingly, the area of the portions of the base outside the stationary ends is large. In this case, the area of the portions of the base outside the stationary ends is preferably as large as possible. More specifically, the area of the residual portions of the base 3 outside the stationary ends is preferably larger than the area of the flexure-vibration members 5.

Figure 4:
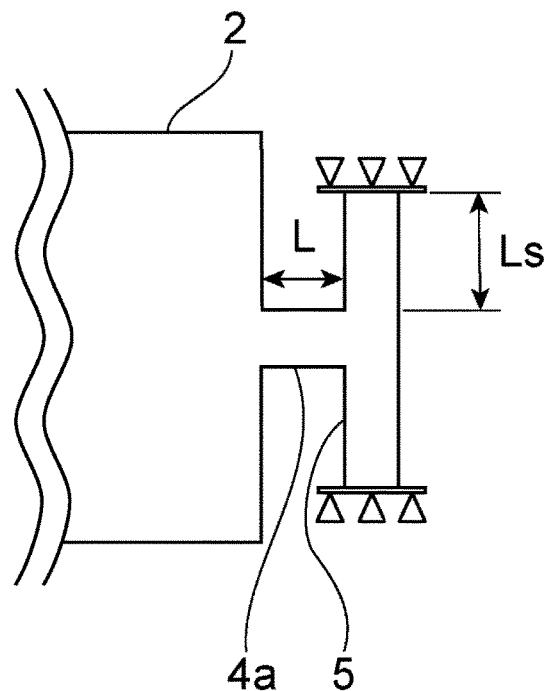
FIG. 4 is a plan view of part of a support member and a flexure-vibration member according to the first embodiment illustrating a dimensional relation between the support member and the flexure-vibration member.

FIG. 4 is a plan view of part of one of the support members and one of the flexure-vibration members illustrating a dimensional relation between the support member and the flexure-vibration member. In FIG. 4, both ends of the flexure-vibration member 5 are schematically illustrated as the stationary ends.

In the embodiment, a length Ls, which corresponds to a distance between a portion of the flexure-vibration member 5 that is connected to the second end portion of the support member 4a and each of the stationary ends of the flexure-vibration member 5, is λ/4 where λ is the wave length of a flexural vibration corresponding to the frequency of a natural vibration in the vibration plate 2. Accordingly, the effect of confining vibrations can be further enhanced also in this way.

In the embodiment, since the area of the portions of the base outside of the stationary ends represented by the dashed lines A is large, as described above, the acoustic reflection effect and the effect of confining vibrations can be enhanced. Since the length Ls is λ/4, the effect of confining vibrations can be further enhanced. These will be described in more detail with reference to FIG. 7.

The vibrating device 1 having specifications subsequently mentioned was manufactured.

Planar shape of the vibration plate 2: Length=500 µm, Width=145 µm.

Length L between the first end portion and second end portion of the support members 4a and 4b: L=5 µm, Size of the support members 4a and 4b in the width direction: Size=5

Figure 7:
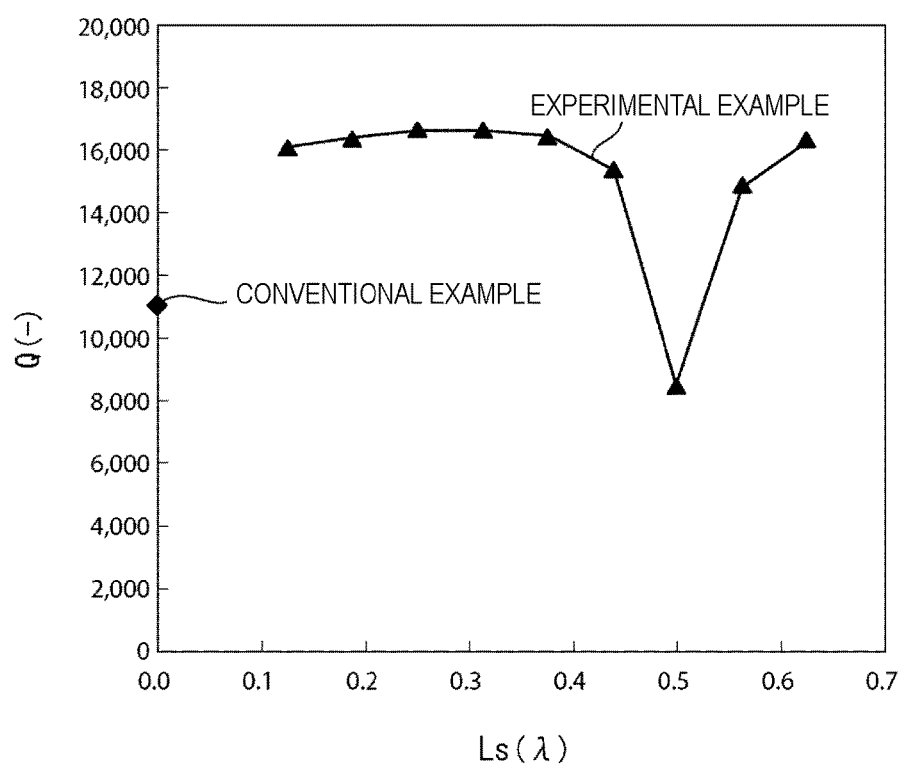
FIG. 7 is a diagram illustrating a relation between a length Ls from a portion of the flexure-vibration member that is connected to the support member to a stationary end of the flexure-vibration member on the outside and Q.

Size of the flexure-vibration members 5 in the width direction: Size=5 µm, Size in the length direction: Size=25 µm Thickness of the Si layer 11: Thickness=10 µm Amount of P dopant, which is an n-type dopant, in the Si layer: Amount=$1\times10^{20}$ pieces/cm$^3$ Thickness of the silicon oxide layer: Thickness=0.3 µm Piezoelectric thin film 12: Aluminum Nitride Film, Thickness=0.8 µm First and second electrodes 13, and 14a to 14e: Mo material, Thickness=0.1 µm In the vibrating device 1, the length Ls was changed into various values. FIG. 7 is a diagram illustrating a relation between the length Ls and Q of a vibration. In FIG. 7, the value of Q in a conventional example using no flexure-vibration members 5 is also illustrated for comparison.

As clear from FIG. 7, a change in the length Ls causes the value of Q to be changed. In particular, as clear from FIG. 7, according to the embodiment, the value of Q is increased in a wider range more effectively than in the case of the conventional example. The reason is presumably that the area of the portions joined to the stationary ends of the flexure-vibration members 5 is increased, that is, the acoustic reflection effect is enhanced and the effect of confining vibrations is improved. It has been clear that the critical coupling coefficient k in the embodiment is the same as the critical coupling coefficient k in the conventional example and is not affected by the length Ls, although this is not illustrated.

In addition, as clear from FIG. 7, a change in the length Ls causes the vibration characteristics to be changed. In particular, as clear from FIG. 7, when the length Ls is 0.25, which is equal to λ/4, the value of Q is very large. In contrast, when the length Ls is about 0.5λ, that is, λ/2, the value of Q significantly decreases.

Thus, in the embodiment, since the length Ls is λ/4, more excellent vibration characteristics can be achieved.

In the vibrating device 1 according to the embodiment, the support members 4a and 4b are connected to vibration node portions in the expansion vibration mode in the rectangular plate, as described above. The flexure-vibration members 5 are disposed on the second end portions of the support members 4a and 4b. The length Ls in the flexure-vibration members 5 is determined to be in the specific range mentioned above such that both ends of the flexure-vibration members 5 are the stationary ends. Accordingly, vibrations can be surely confined within the portions up to the flexure-vibration members 5, and excellent vibration characteristics can be achieved.

In the case of a fundamental wave of a contour vibration, a single vibration member is held by a pair of support members. In contrast, in the embodiment, the five vibration members 2a to 2e are held by the two pairs of the support members 4a and 4b. That is, a vibration is created at a fifth harmonic of a contour vibration, and the five vibration members 2a to 2e are held by the two pairs of the support members 4a and 4b. Accordingly, in the vibrating device 1 according to the embodiment, a hold loss in an in-plane vibration direction is relatively reduced.

In addition, in the embodiment, the degree of freedom of a displacement in an out-of-plane direction is decreased because of the hold by the two pairs of the support members 4a and 4b, and a hold loss due to out-of-plane flexure is also reduced. In addition, the impact resistance can be increased because of the hold by the support members. Accordingly, the vibration characteristics can be further improved.

Figure 5:
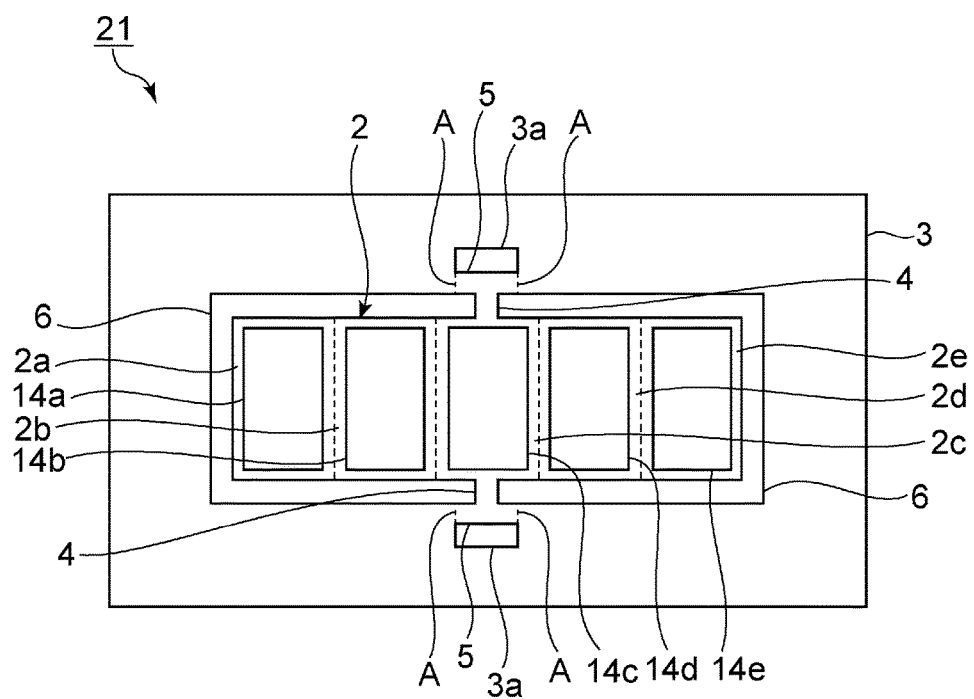
FIG. 5 is a plan view of a vibrating device according to a second embodiment.

The five vibration members 2a to 2e are held by the two pairs of the support members 4a and 4b in the first embodiment. However, as in the case of a vibrating device 21 according to a second embodiment illustrated in FIG. 5, the five vibration members 2a to 2e may be held by a pair of support members 4. In the second embodiment, the pair of the support members 4 are connected to vibration nodes located at the center of the vibration member 2c in the width direction. That is, the five vibration members 2a to 2e are held by the pair of the support members 4. The other features are the same as in the first embodiment.

Figure 6:
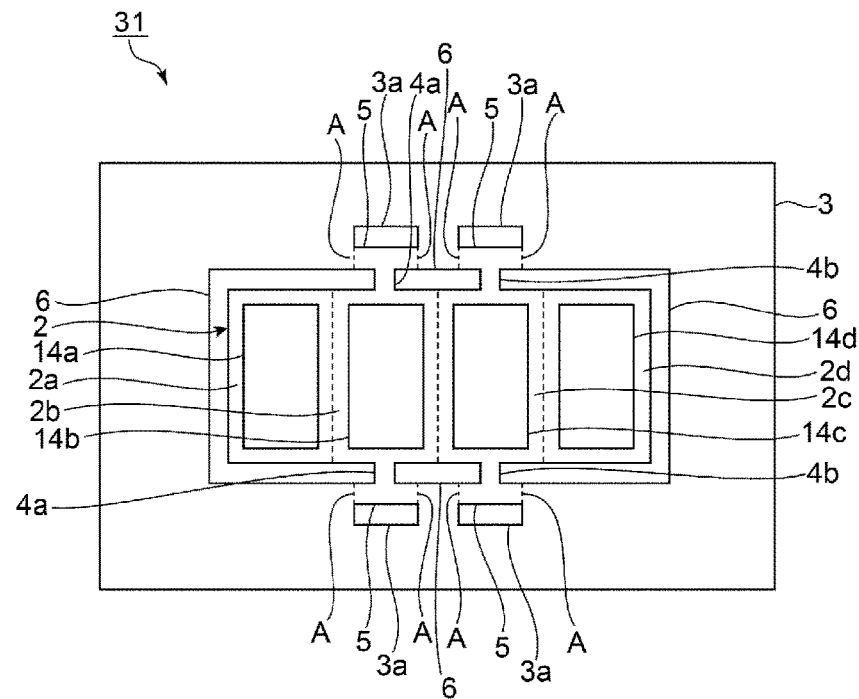
FIG. 6 is a plan view of a vibrating device according to a third embodiment.

The vibration plate 2 including the five vibration members 2a to 2e is used in the first embodiment and the second embodiment. However, as in the case of a vibrating device 31 according to a third embodiment illustrated in FIG. 6, a vibration plate 2 having four vibration members 2a to 2d may be used. In the third embodiment, the four vibration members 2a to 2d are held by two pairs of support members 4a and 4b. That is, a vibration is created at a fourth harmonic of a contour vibration, and the four vibration members 2a to 2d are held by the two pairs of the support members 4a and 4b.

Also, in the second embodiment and the third embodiment, the support members 4 or the support members 4a and 4b are connected to the vibration node portions in the expansion vibration mode in the rectangular plate. The flexure-vibration members 5 are disposed on the second end portions of the support members 4 or the support members 4a and 4b. The length Ls in the flexure-vibration members 5 is determined to be in the specific range mentioned above such that both ends of the flexure-vibration members 5 are the stationary ends. Accordingly, vibrations can be surely confined within the portions up to the flexure-vibration members 5, and excellent vibration characteristics can be achieved.

Figure 8:
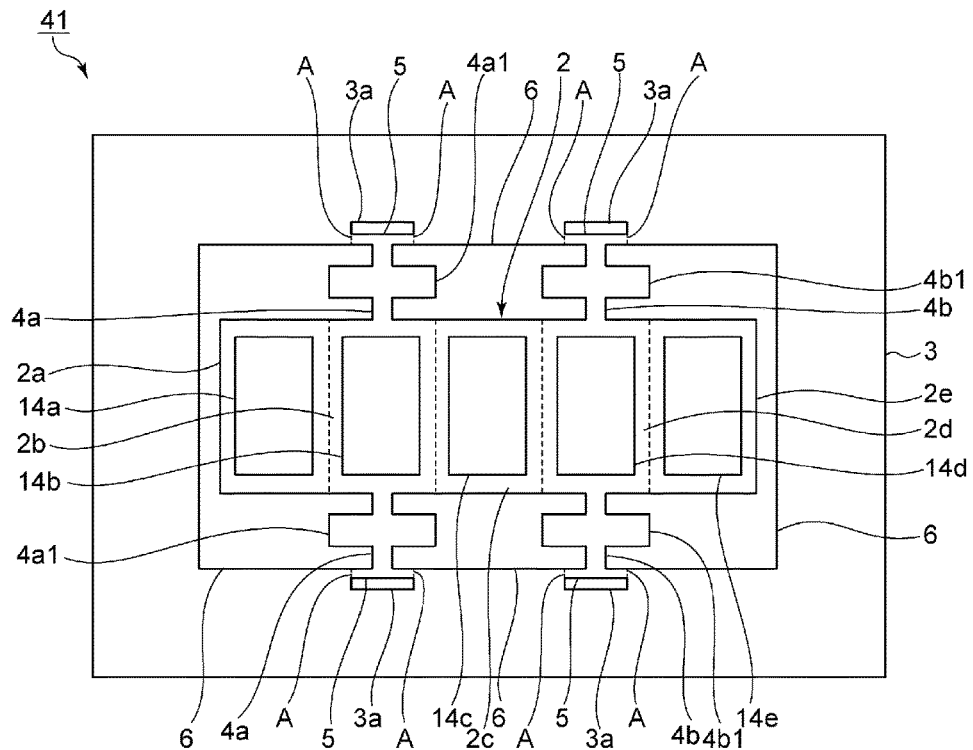
FIG. 8 is a plan view of a vibrating device according to a fourth embodiment.
Figure 9:
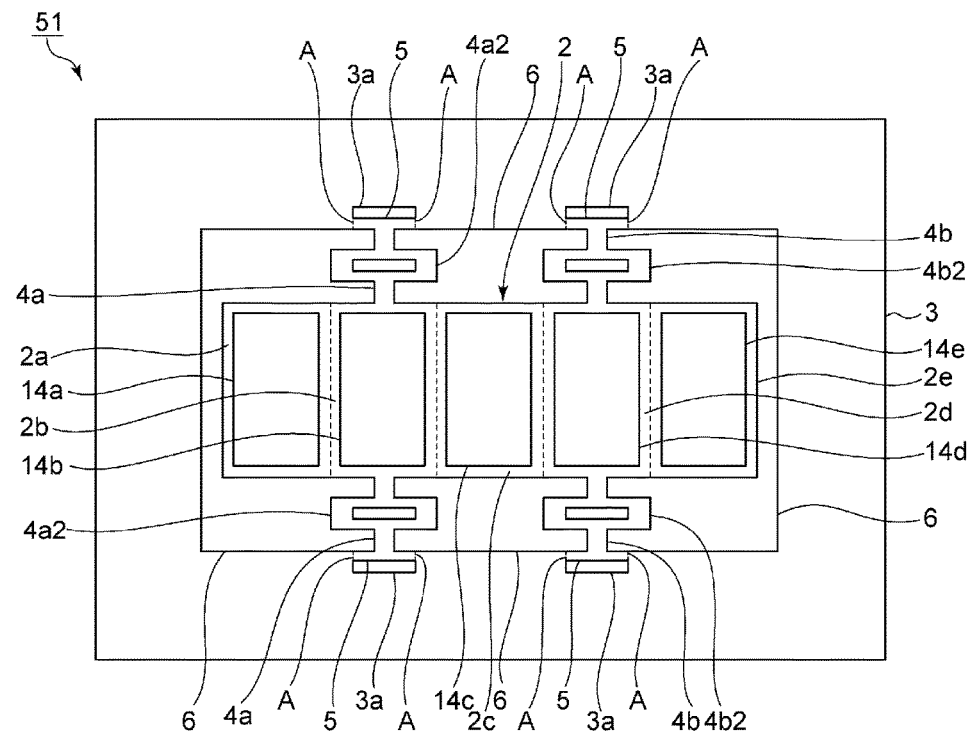
FIG. 9 is a plan view of a vibrating device according to a fifth embodiment.

FIG. 8 illustrates a plan view of a vibrating device 41 according to another exemplary embodiment. As shown, the vibrating device 41 includes dynamic vibration absorbers 4a1 and 4b1 that protrude in the direction perpendicular to the support members 4a and 4b may be disposed on the support members 4a and 4b. Similarly, FIG. 9 illustrates a plan view of a vibrating device 51 according to yet another embodiment. As shown, the vibrating device 51 includes vibration dampeners 4a2 and 4b2 that may be disposed on the support members 4a and 4b.

In the vibrating devices 41 and 51 according to these exemplary embodiments, the support members 4a and 4b include the dynamic vibration absorbers 4a1 and 4b1 or the vibration dampeners 4a2 and 4b2. Accordingly, propagation of vibrations to the flexure-vibration members 5 can be suppressed, and vibrations that has propagated at a harmonic of a contour vibration from the vibration plate 2 can be more surely confined.

REFERENCE SIGNS LIST 1, 21, 31, 41, 51 . . . vibrating device

2 . . . vibration plate 2a to 2e . . . vibration member
3 . . . base
3a . . . cavity
4, 4a, 4b . . . support member
4a1, 4b1 . . . dynamic vibration absorber
4a2, 4b2 . . . vibration dampener
5 . . . flexure-vibration member
6, 6A . . . through-slot
11 . . . Si layer
12 . . . piezoelectric thin film
13, 13a to 13e . . . first electrode
14a to 14e . . . second electrode

The invention claimed is:

1. A vibrating device comprising:
a vibration plate that vibrates at a harmonic of a contour vibration and has a natural mode vibration frequency, the vibration plate comprising a plurality of vibration members;
a frame base surrounding the vibration plate and having at least one flexure-vibration member with a respective cavity in the frame base adjacent to the flexure vibration member;
at least one support member that supports the vibration plate and that has a first end connected to a vibration node of one of the plurality of vibration members and a second end connected to the at least one flexure-vibration member of the frame base, respectively;
wherein the cavity extends in a direction perpendicular to the at least one support member, such that respective ends of the at least one flexure-vibration member serve as stationary ends adjacent to ends of the cavity, respectively,
wherein the at least one flexure-vibration member has a connection portion where the second end of the at least one support member is connected to the at least one flexure-vibration member, and
wherein a length between each of the stationary ends of the flexure-vibration member and respective edges where the connection portion is connected to the at least one support member is $\lambda/4$, wherein $\lambda$ is a wave length of a flexural vibration corresponding to the natural mode vibration frequency.

2. The vibrating device according to claim 1, wherein the vibration plate, the at least one support member, and the frame base form a single plate.

3. The vibrating device according to claim 1, further comprising a plurality of through-slots between the vibration plate and the frame base.

4. The vibrating device according to claim 3, wherein the plurality of through-slots surround the vibration plate except where the at least one support member connects the at least one vibration member to the at least one flexure-vibration member, respectively.

5. The vibrating device according to claim 1, wherein the plurality of vibration members each include a Si layer made of a degenerate semiconductor, at least one first electrode disposed on the Si layer, a piezoelectric thin film disposed on the at least one first electrode, and at least one second electrode disposed on the piezoelectric thin film.

6. The vibrating device according to claim 5, wherein the at least one first electrode comprises a plurality of first electrodes that each comprise a respective vibration member of the plurality of vibration members.

7. The vibrating device according to claim 5, wherein the at least one second electrode comprises a plurality of second electrodes that form the plurality of vibration members with the plurality of first electrode, respectively.

8. The vibrating device according to claim 1, wherein a distance between an outer circumferential edge of the vibration plate and the frame base is equal to a distance between the outer circumferential edge of the vibration plate and the flexure-vibration member.

9. The vibrating device according to claim 1, wherein a distance between an outer circumferential edge of the vibration plate and the frame base is less than a distance between the outer circumferential edge of the vibration plate and the flexure-vibration member.

10. The vibrating device according to claim 1, wherein the at least one support member comprises a pair of support members.

11. The vibrating device according to claim 1, wherein the support member comprises a plurality of pairs of support members.

12. The vibrating device according to claim 1, wherein adjacent vibration members of the plurality of vibration members vibrate in anti-phase with respect to each other.

13. The vibrating device according to claim 1, wherein an electrical potential is applied to adjoining vibration members of the plurality vibration members in anti-phase with each other.

14. The vibrating device according to claim 1, further comprising at least a pair of vibration absorbers that extend from respective sides of the at least one support member.

15. The vibrating device according to claim 14, wherein the pair of vibration absorbers do not contact at least one of the frame base and the vibration plate.

16. A vibrating device comprising:
a vibration plate that includes a plurality of vibration members;
a frame base surrounding the vibration plate and having a plurality of flexure-vibration members; and
a plurality of support members that couple the plurality of flexure-vibration members to the plurality of vibration members, respectively,
wherein the frame base has a plurality of cavities disposed therein that are adjacent to the plurality of flexure-vibration members, respectively, wherein the plurality of cavities each extend in a direction parallel to side surfaces of the vibration plate,
wherein each of the plurality of flexure-vibration members has a connection portion where the flexure-vibration member is connected to a respective support member, and
wherein a length between an end of each flexure-vibration member and the connection portion of the flexure-vibration member is $\lambda/4$, wherein $\lambda$ is a wave length of a flexural vibration corresponding to a natural mode vibration frequency of the vibration plate.

17. The vibrating device according to claim 16, wherein the plurality of flexure-vibration members are disposed between the plurality of support members and the plurality of cavities, respectively.

18. The vibrating device according to claim 16, further comprising a plurality of through-slots between the vibration plate and the frame base, such that the plurality of through-slots surround the vibration plate except where the plurality of support members connect the plurality of vibration members to the plurality of flexure-vibration members, respectively.

19. The vibrating device according to claim 16, wherein the plurality of vibration members each include a Si layer made of a degenerate semiconductor, at least one first electrode disposed on the Si layer, a piezoelectric thin film disposed on the at least one first electrode, and at least one second electrode disposed on the piezoelectric thin film.

20. The vibrating device according to claim 16, wherein a distance between an outer circumferential edge of the vibration plate and the frame base is less than a distance between the outer circumferential edge of the vibration plate and the flexure-vibration member.

\* \* \* \* \*